(12) United States Patent
Summerfelt et al.

(10) Patent No.: US 6,204,069 B1
(45) Date of Patent: Mar. 20, 2001

(54) LIGHTLY DONOR DOPED ELECTRODES FOR HIGH-DIELECTRIC-CONSTANT MATERIALS

(75) Inventors: Scott R. Summerfelt, Dallas; Howard R. Beratan, Richardson; Bruce Gnade, Rowlett, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/317,108

(22) Filed: Oct. 3, 1994

Related U.S. Application Data

(63) Continuation of application No. 08/040,946, filed on Mar. 31, 1993, now abandoned.

(51) Int. Cl.$^7$ .................................................. H01L 21/00
(52) U.S. Cl. ................ 438/3; 427/80; 427/100; 427/419.3; 427/126.3; 427/79; 501/138; 501/139; 438/240
(58) Field of Search ................ 427/79, 80, 100, 427/126.3, 419.3; 501/138, 139; 437/255

(56) References Cited

U.S. PATENT DOCUMENTS

| | | | |
|---|---|---|---|
| 3,268,783 | * 8/1966 | Saburi | 501/137 |
| 3,305,304 | * 2/1967 | Koiser et al. | 427/79 |
| 3,569,802 | 3/1971 | Brauer | 317/238 |
| 4,131,903 | 12/1978 | Schmelz et al. | 357/10 |
| 4,149,173 | 4/1979 | Schmelz et al. | 357/10 |
| 5,003,428 | 3/1991 | Shepherd | 361/321 |
| 5,053,917 | 10/1991 | Miyaskea et al. | 361/321 |
| 5,155,658 | 10/1992 | Imam et al. | 361/321 |
| 5,162,294 | * 11/1992 | Telvecchio et al. | 427/419.3 |
| 5,198,269 | * 3/1993 | Swartz et al. | 427/419.3 |
| 5,206,213 | * 4/1993 | Lyomo et al. | 427/419.3 |
| 5,262,920 | 11/1993 | Sakuma et al. | 361/321.5 |

FOREIGN PATENT DOCUMENTS

A2 2 337 373  11/1989 (EP) ................ H01G/1/01

OTHER PUBLICATIONS

C. J. Peng and H. Y. Lu, "Compensation Effect in Semiconducting Barium Titanate," *J. Am. Ceram. Soc.*, 71 C44–C46 (1988).

(List continued on next page.)

*Primary Examiner*—Brian K. Talbot
(74) *Attorney, Agent, or Firm*—Bret J. Petersen; Frederick J. Telecky, Jr.

(57) ABSTRACT

A preferred embodiment of this invention comprises a conductive lightly donor doped perovskite layer (e.g. lightly La doped BST 34), and a high-dielectric-constant material layer (e.g. undoped BST 36) overlaying the conductive lightly donor doped perovskite layer. The conductive lightly donor doped perovskite layer provides a substantially chemically and structurally stable electrical connection to the high-dielectric-constant material layer. A lightly donor doped perovskite generally has much less resistance than undoped, acceptor doped, or heavily donor doped HDC materials. The amount of donor doping to make the material conductive (or resistive) is normally dependent on the process conditions (e.g. temperature, atmosphere, grain size, film thickness and composition). This resistivity may be further decreased if the perovskite is exposed to reducing conditions. The lightly donor doped perovskite can be deposited and etched by effectively the same techniques that are developed for the high-dielectric-constant material. The same equipment may used to deposit and etch both the perovskite electrode and the dielectric. These structures may also be used for multilayer capacitors and other thin-film ferroelectric devices such as pyroelectric materials, non-volatile memories, thin-film piezoelectric and thin-film electro-optic oxides.

16 Claims, 3 Drawing Sheets

OTHER PUBLICATIONS

N. Parikh, et al., "Study of Diffusion Barriers for PZT Deposited on Si for Non–Volatile Random–Access Memory Technology," *Mat. Res. Soc. Symp. Proc.*, vol. 200, 1990, pp. 193–198.

A. F. Tasch, Jr. and L. H. Parker, "Memory Cell and Technology Issues for 64 and 256–Mbit One–Transistor Cell MOS DRAMs," *Proceedings of the IEEE,* vol. 77, No. 3, Mar. 1989, pp. 374–388.

K. Koyama, et al., "A Stacked Capacitor with $(Ba_xSr_{1-x})TiO_3$ For 256b M DRAM," *IEDM*, 91, 823–826 (1991).

T. Sakuma, et al., "Barrier Layers for Realization of High Capacitance Density in $SrTiO_3$ Thin–Film Capacitor on Silicon," *Appl. Phys. Lett.*, 57 (23), Dec. 3, 1990, pgs. 2431–2433.

K. Takemura, et al., "Barrier Mechanism of Pt/Ta and Pt/Ti Layers for $SrTiO_3$ Thin Film Capacitors on Si," *4th Inter. Symp. on Integrated Ferroelectrics*, C52 (1992).

Kenji Uchino, "Electrodes for Piezoelectric Actuators [Atuden Akuchueita–yo Denkyoku] Ceramics", Ceramics Japan, vol. 21, No. 3, 1986, pp. 229–236.

\* cited by examiner

LIGHTLY DONOR DOPED ELECTRODES FOR HIGH-DIELECTRIC-CONSTANT MATERIALS

This application is a Continuation of application Ser. No. 08/040,946, filed Mar. 31, 1993 now abandoned.

FIELD OF THE INVENTION

This invention generally relates to improving electrical connections to materials with high-dielectric-constants, such as in the construction of capacitors.

BACKGROUND OF THE INVENTION

Without limiting the scope of the invention, its background is described in connection with current methods of forming electrical connections to high-dielectric-constant materials, as an example.

The increasing density of integrated circuits (e.g. DRAMs) is increasing the need for materials with high-dielectric-constants to be used in electrical devices such as capacitors. The current method generally utilized to achieve higher capacitance per unit area is to increase the surface area/unit area by increasing the topography, such as in trench and stack capacitors using $SiO_2$ or $SiO_2/Si_3N_4$ as the dielectric. This approach becomes very difficult in terms of manufacturability for devices such as the 256 Mbit and 1 Gbit DRAMs.

An alternative approach is to use a high permittivity dielectric material. Many perovskite, ferroelectric, or high-dielectric-constant (hereafter abbreviated HDC) materials such as $(Ba,Sr)TiO_3$ (BST) usually have much larger capacitance densities than standard $SiO_2$—$Si_3N_4$—$SiO_2$ capacitors. Various metals and metallic compounds, and typically noble metals such as Pt and conductive oxides such as $RuO_2$, have been proposed as the electrodes for these HDC materials. To be useful in electronic devices, however, reliable electrical connections should generally be constructed which do not diminish the beneficial properties of these high-dielectric-constant materials.

SUMMARY OF THE INVENTION

As used herein the term high-dielectric-constant means a dielectric constant greater than about 150. The deposition of an HDC material usually occurs at high temperature (generally greater than about 500° C.) in an oxygen containing atmosphere. The lower electrode structure should be stable during this deposition, and both the lower and upper electrode structures should be stable after this deposition. There are several problems with the materials thus far chosen for the lower electrode in thin-film (generally less than 5 um) applications; many of these problems are related to semiconductor process integration. For example, Ru is generally not a standard integrated circuit manufacturing material, and it is also relatively toxic. Pt has several problems as a lower electrode which hinder it being used alone. Pt generally allows oxygen to diffuse through it and hence typically allows neighboring materials to oxidize. Pt also does not normally stick very well to traditional dielectrics such as $SiO_2$ or $Si_3N_4$, and Pt can rapidly form a silicide at low temperatures. A Ta layer has been used as a sticking or buffer layer under the Pt electrode, however during BST deposition, oxygen can diffuse through the Pt and oxidize the Ta and make the Ta less conductive. This may possibly be acceptable for structures in which contact is made directly to the Pt layer instead of to the Ta layer, but there are other associated problems as described hereinbelow.

Other structures which have been proposed include alloys of Pt, Pd, Rh as the electrode and oxides made of Re, Os, Rh and Ir as the sticking layer on single crystal Si or poly-Si. A problem with these electrodes is that these oxides are generally not stable next to Si and that these metals typically rapidly form silicides at low temperatures (generally less than about 450° C.).

One difficulty with the previous solutions is that they generally utilize materials (e.g. Ru) which are unusual in a semiconductor fab. Another difficulty is that a relatively good dry etch for Pt or $RuO_2$ does not yet exist. As another example, there currently does not exist a commercial chemical vapor deposition process for Pt or Ru. In addition, Pt is normally a fast diffuser in Si and therefore can cause other problems. Also, most of the proposed electrode structures require several additional process steps which can be uneconomical. For example, there currently does not exist a commercial chemical vapor deposition process for Pt or Ru, nor a commercial dry etch for $RuO_2$.

Generally, the instant invention uses a lightly donor doped perovskite as the electrode in a thin-film microelectronic structure. An electrode buffer layer may also be used as a sticking layer and/or diffusion barrier and/or electrical connection, if needed. A lightly donor doped perovskite generally has much less resistance than undoped, acceptor doped, or heavily donor doped HDC materials. The bulk resistivity of a typical lightly doped perovskite such as $BaTiO_3$ is generally between about 10 to 100 ohm-cm. Also, this resistivity may be further decreased if the perovskite is exposed to reducing conditions. Conversely, the perovskite can achieve a high resistivity (about $10^{10}$–$10^{14}$ ohm-cm) for large donor concentrations. The amount of donor doping to make the material conductive (or resistive) is normally dependent on the process conditions (e.g. temperature, atmosphere, grain size, film thickness and composition). There exists a large number of perovskite, perovskite-like, ferroelectric or HDC oxides that can become conductive with light donor doping.

The deposition of the lightly donor doped perovskite lower electrode may be performed in a slightly reducing atmosphere in order to minimize the oxidation of the layer(s) underneath it. The subsequent deposition of the HDC dielectric material can require very oxidizing conditions, and the lightly donor doped perovskite lower electrode slows the oxidation rate of the layer(s) underneath it, thus inhibiting the formation of a substantially oxidized continuous resistive contact layer. Another benefit of this electrode system is that the lightly donor doped perovskite lower electrode does little or no reduction of the HDC dielectric material.

The disclosed structures generally provide electrical connection to HDC materials while eliminating many of the disadvantages of the current structures. One embodiment of this invention comprises a conductive lightly donor doped perovskite layer, and a high-dielectric-constant material layer overlaying the conductive lightly donor doped perovskite layer. The conductive lightly donor doped perovskite layer provides a substantially chemically and structurally stable electrical connection to the high-dielectric-constant material layer. A method of forming an embodiment of this invention comprises the steps of forming a conductive lightly donor doped perovskite layer, and forming a high-dielectric-constant material layer on the conductive lightly donor doped perovskite layer.

These are apparently the first thin-film structures wherein an electrical connection to high-dielectric-constant materials comprises a conductive lightly donor doped perovskite.

Lightly donor doped perovskite can generally be deposited and etched by effectively the same techniques that are developed for the dielectric. The same equipment may be used to deposit and etch both the perovskite electrode and the dielectric. These structures may also be used for multi-layer capacitors and other thin-film ferroelectric devices such as pyroelectric materials, non-volatile memories, thin-film piezoelectric and thin-film electro-optic oxides.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE PREFERRED EMBODIMENTS

Figure 1:
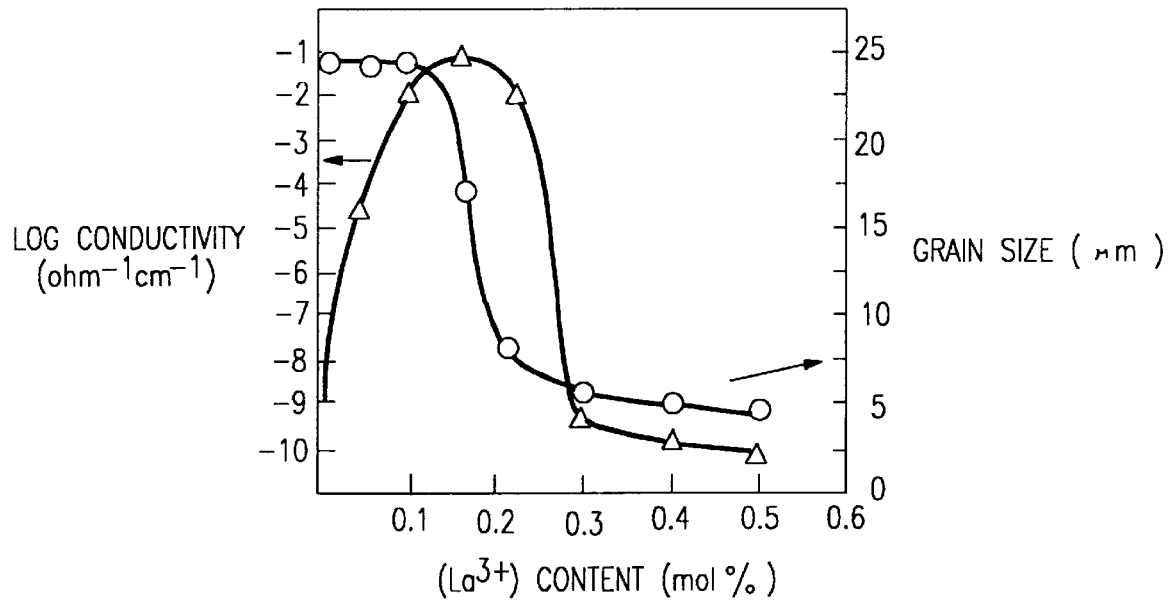
FIG. 1 is a graph depicting the effect of La donor doping on the room-temperature conductivity and the grain size of $BaTiO_3$.

With reference to FIG. 1, there is shown a graph depicting the effect of La donor doping on the room-temperature conductivity and the grain size of bulk $BaTiO_3$ (BT). BT is generally considered to be a model perovskite material, and similar perovskites such as $SrTiO_3$ (ST) and $(Ba,Sr)TiO_3$ should behave similarly. The bulk resistivity of the lightly donor doped perovskite is generally between about 10 to 100 ohm-cm. Also, this resistivity may be further decreased if the perovskite is exposed to reducing conditions. The perovskite can also achieve a high resistivity (about $10^{10}$ to $10^{14}$ ohm-cm) for large donor concentrations. The amount of donor doping to make the material conductive (or resistive) is normally dependent on the process conditions (e.g. temperature, atmosphere, grain size, film thickness and composition).

As used herein, the term "lightly", when used in reference to doping of a perovskite, means a level of doping which produces a substantially lower resistivity than that of an undoped version of the perovskite (e.g. a doping between about 0.01 and about 0.3 mole percent). Generally such lower resistivity is also substantially lower than the resistivity of a heavily doped version of the perovskite. Donor doping, as known in the art, is generally the substitution of atoms on lattice sites which, due to the higher valence of the substituting atoms (as compared to the valence of the atoms being replaced), results in free electrons.

Figure 2:
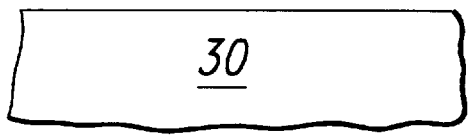
FIGS. 2, 3, 4, 5, and 6 are cross-sectional views of a method for constructing a capacitor with a lightly donor doped perovskite lower electrode on a semiconductor substrate.
Figure 3:
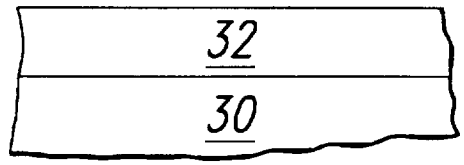
Figure 4:
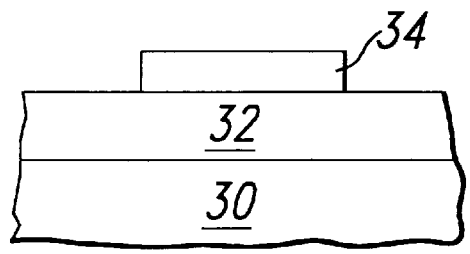
Figure 5:
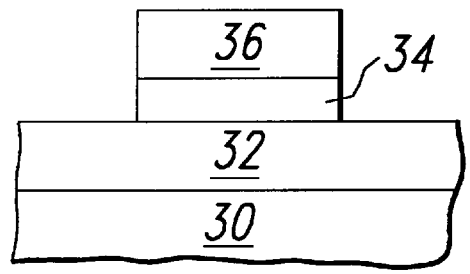
Figure 6:
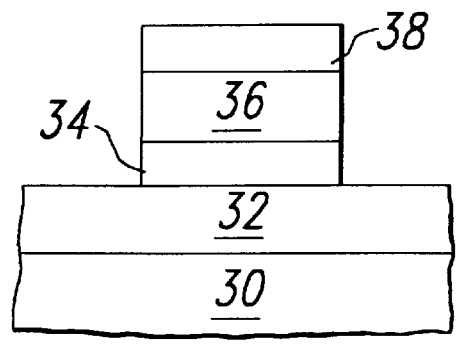

With reference to FIGS. 2–6, there is shown a method of forming a preferred embodiment of this invention, a capacitor comprising a high-dielectric-constant material and a lightly donor doped perovskite lower electrode. FIG. 2 illustrates a silicon semiconductor substrate 30. FIG. 3 illustrates an $SiO_2$ insulating layer 32 formed on the surface of the silicon substrate 30. FIG. 4 illustrates a lightly La donor doped BST layer 34 deposited on the $SiO_2$ layer 32. This lightly La donor doped BST layer 34 is conductive and will serve as the lower electrode for the high-dielectric-constant capacitor. FIG. 5 illustrates the capacitor dielectric, a layer of undoped high-dielectric-constant BST 36, deposited on the lightly La donor doped BST layer 34. Although undoped BST may be used for the capacitor dielectric, acceptor doped or heavily donor doped BST may also be used to provide a high-dielectric-constant. FIG. 6 illustrates the TiN upper electrode 38 deposited on the undoped BST layer 36. TiN is generally a good sticking layer and diffusion barrier, in addition to being conductive. Alternatively, another layer of lightly La donor doped BST could be used instead of TiN for the upper electrode 38.

Figure 7:
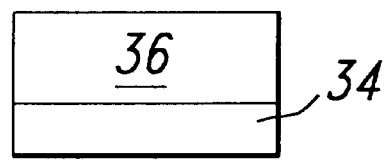
FIG. 7 is a cross-sectional view of a high-dielectric-constant material formed on a lightly donor doped perovskite.

In an alternate embodiment, FIG. 7 illustrates a layer of undoped high-dielectric-constant BST 36 deposited on a lightly La donor doped BST layer 34. The lightly La donor doped BST layer 34 provides a chemically and structurally stable electrical connection to the undoped high-dielectric-constant BST layer 36.

Figure 8:
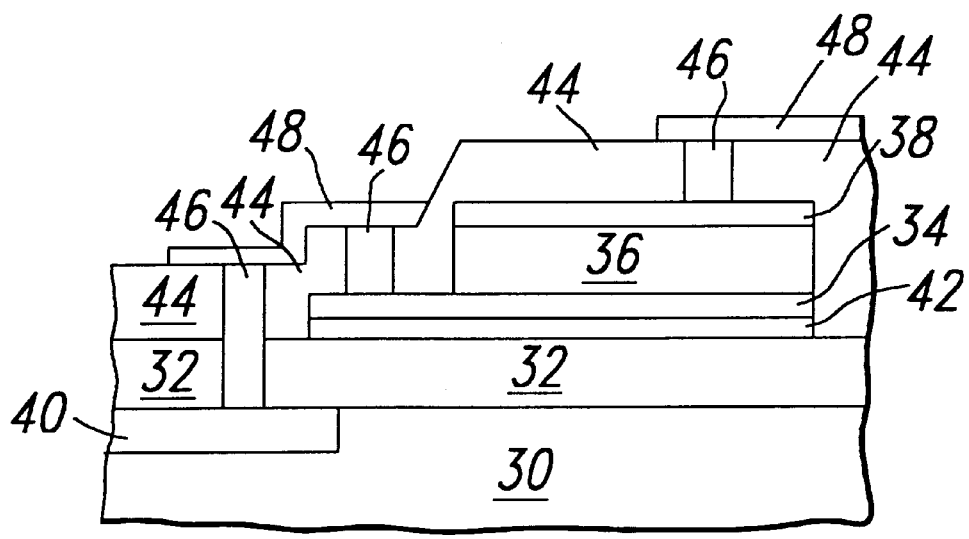

In another alternate embodiment, FIG. 8 illustrates a high-dielectric-constant capacitor utilizing a lightly donor doped perovskite electrode. The TiN upper electrode 38 overlays the undoped BST layer 36, which in turn overlays the lightly La donor doped BST lower electrode 34. However, the lightly La donor doped BST 34 is not formed directly on the first $SiO_2$ insulating layer 32, but is instead shown formed on a TiN electrode buffer layer 42. The TiN electrode buffer layer 42 is used as a sticking layer and diffusion barrier for silicon, oxygen and impurities in the high-dielectric-constant BST layer 36. Other materials such as $RuO_2$/Ru can also be used instead of TiN for that purpose. For example, Ru metal could be deposited, and would for the most part form $RuO_2$ during the deposition of the lightly La donor doped BST layer 34 or of the undoped high-dielectric-constant BST layer 36. In this embodiment the TiN electrode buffer layer 42 is not used for direct electrical connection since electrical contact is made directly to the lightly La donor doped BST layer 34 from above, via a conductive tungsten plug 46. The tungsten plug 46 makes electrical contact to the aluminum top metallization 48 through the second $SiO_2$ insulating layer 44. The two other tungsten plugs 46 make electrical contact from the aluminum top metallization layer 48 to the TiN upper electrode 38 and to the doped silicon region 40.

Figure 9:
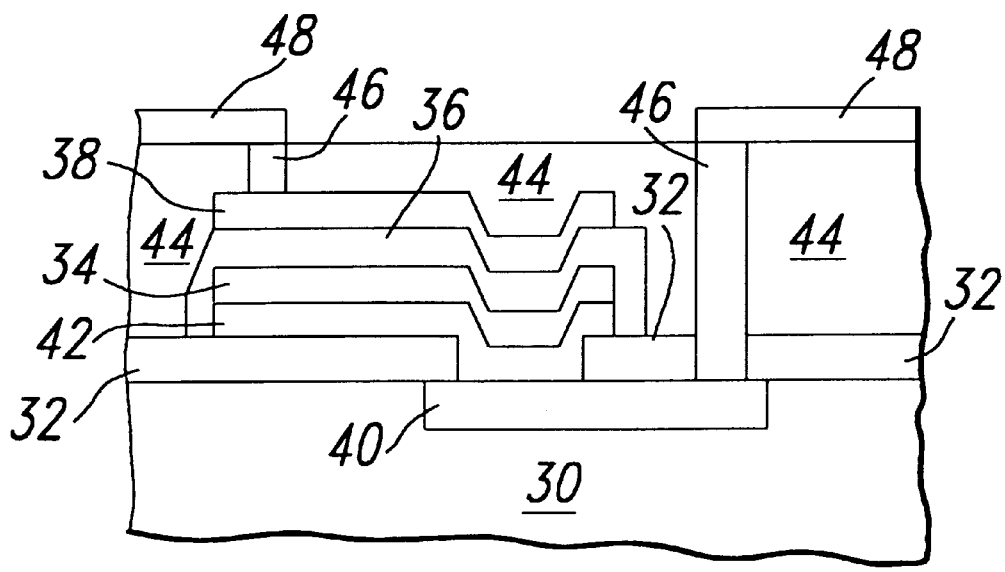

In another alternate embodiment, FIG. 9 illustrates a high-dielectric-constant capacitor utilizing a lightly donor doped perovskite electrode. As in FIG. 8, the lightly La donor doped BST lower electrode 34 is again formed on a TiN electrode buffer layer 42. However, in FIG. 9, the TiN electrode buffer layer 42 provides electrical connection to the doped silicon region 40 below it. TiN also works relatively well in this embodiment because it must undergo substantial oxidation before it forms an insulating titanium oxide. For example, TiON and TiO are conductive, although $TiO_2$ is insulating.

The deposition of the lightly La donor doped BST lower electrode 34 is preferably performed in a slightly reducing atmosphere when utilizing the TiN lower electrode buffer layer 42 in order to minimize the oxidation of the TiN. The deposition of the undoped high-dielectric-constant BST layer 36 generally requires very oxidizing conditions and the lightly La donor doped BST lower electrode 34 will significantly slow the oxidation rate of the TiN electrode buffer layer 42, thus inhibiting the formation of a substantially oxidized continuous resistive contact layer. Another benefit of this electrode system is that the lightly donor doped BST lower electrode does little, if any, reduction the undoped BST layer 36.

Figure 10:
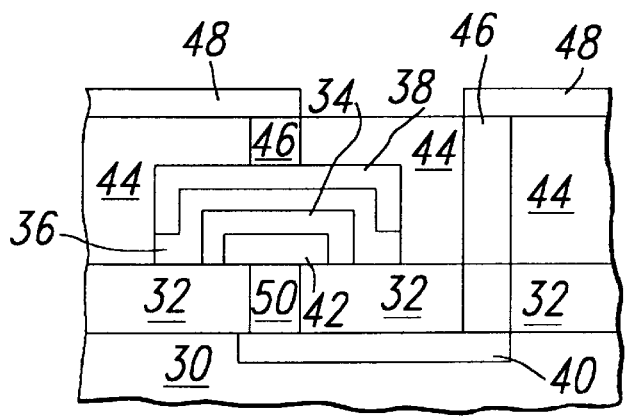
FIGS. 8, 9, and 10 are cross-sectional views of capacitors with lightly donor doped perovskite lower electrodes formed on the surface of a semiconductor substrate.

In yet another alternate embodiment, FIG. 10 illustrates a high-dielectric-constant capacitor utilizing a lightly donor doped perovskite electrode. As in FIG. 9, the TiN electrode buffer layer 42 is used for electrical contact. However, in FIG. 10, the TiN electrode buffer layer 42 connects to the doped silicon region 40 via a tungsten plug 50.

Alternatively, the tungsten (or TiN) plug 50 in FIG. 10 could also be used to connect directly to the lightly La donor doped BST lower electrode 34, if the TiN electrode buffer layer 42 were not used. However, this would generally utilize the lightly La donor doped BST lower electrode 34 as an oxygen diffusion barrier and hence may not protect the tungsten plug 50 under all possible oxidizing conditions.

The sole Table, below, provides an overview of some embodiments and the drawings.

TABLE

| Drawing Element | Generic Term | Preferred or Specific Examples | Other Alternate Examples |
|---|---|---|---|
| 30 | Substrate | Silicon | Other single component semiconductors (e.g. germanium, diamond) Compound semiconductors (e.g. GaAs, InP, Si/Ge, SiC) Ceramic substrates |
| 32 | First level insulator | Silicon dioxide | Other insulators (e.g. silicon nitride) |
| 34 | Lower electrode | 0.1 to 0.2 mol % La doped barium strontium titanate | 0.01 to 0.29 mol % La doped barium strontium titanate Other lightly donor (e.g. F, Cl, V, Nb, Mo, La, Ce, Pr, Nd, Sm, Eu, Gd, Tb, Dy, Ho, Er, Ta, W) doped perovskite, ferroelectric, or high-dielectric-constant oxides (e.g. (Ba,Sr,Pb)(Ti,Zr)O$_3$, bismuth titanate, potassium tantalate, lead niobate, potassium niobate, lead zinc niobate, lead magnesium niobate) |
| 36 | High-dielectric-constant material | Undoped barium strontium titanate | Other undoped perovskite, ferroelectric, or high-dielectric-constant oxides (e.g. (Ba,Sr,Pb)(Ti,Zr)O$_3$, (Pb,La)(Zr,Ti)O$_3$, bismuth titanate, potassium tantalate, lead niobate, potassium niobate, lead zinc niobate, lead magnesium niobate) Acceptor (e.g. Na, Al, Mn, Ca, K, Cr, Mn, Co, Ni, Cu, Zn, Li, Mg) and/or heavily (generally greater than 0.25 mol %) donor (e.g. F, Cl, V, Nb, Mo, La, Ce, Pr, Nd, Sm, Eu, Gd, Tb, Dy, Ho, Er, Ta, W) doped perovskite, ferroelectric, or high-dielectric-constant oxides (e.g. (Ba,Sr,Pb)(Ti,Zr)O$_3$, bismuth titanate, potassium tantalate, lead niobate, potassium niobate, lead zinc niobate, lead magnesium niobate) |
| 38 | Upper electrode | Titanium nitride | Other conductive metal compounds (e.g. nitrides: ruthenium nitride, tin nitride, zirconium nitride; oxides: ruthenium dioxide, tin oxide, titanium monoxide) Noble metals (e.g. platinum, palladium, rhodium, gold, iridium, silver) May be same materials as those listed for Drawing Element 34 above Other common semiconductor electrodes (e.g. silicides, aluminum) May contain more than one layer |
| 40 | Conductive semiconductor material | Doped silicon | Semiconductor devices |
| 42 | Electrode buffer layer | Titanium nitride | Other conductive metal compounds (e.g. nitrides: ruthenium nitride, tin nitride, zirconium nitride; oxides: ruthenium dioxide, tin oxide, titanium monoxide, TiON silicides: titanium silicide) Combinations of above mentioned materials (e.g. TiN/TiO/TiON, TiN/TiSi, Ru/RuO/RuO$_2$) Other high temperature conductive diffusion barriers This layer may or may not be used |
| 44 | Second level insulator | Silicon dioxide | Other insulators (e.g. silicon nitride) |
| 46 | Conductive plug | Tungsten | Other reactive metals (e.g. tantalum, titanium, molybdenum) Reactive metal compounds (e.g. nitrides: titanium nitride, zirconium nitride; silicides: titanium silicide, tantalum silicide, tungsten silicide, molybdenum silicide, nickel silicide; carbides: tantalum carbide; borides: titanium boride) Conductive carbides and borides (e.g. boron carbide) Aluminum, copper Single component semiconductors (e.g. single crystalline and polycrystalline silicon, germanium) Compound semiconductors (e.g. GaAs, InP, Si/Ge, SiC) |
| 48 | Top metallization | Aluminum | Other common semiconductor electrodes (e.g. silicides, TiN) Two or more layers of metal and dielectric |
| 50 | Capacitor plug | Tungsten | Other reactive metals (e.g. tantalum, titanium, molybdenum) Reactive metal compounds (e.g. nitrides: titanium nitride, zirconium nitride; |

TABLE-continued

| Drawing Element | Generic Term | Preferred or Specific Examples | Other Alternate Examples |
|---|---|---|---|
| | | | silicides: titanium silicide, tantalum silicide, tungsten silicide, molybdenum silicide, nickel silicide; carbides: tantalum carbide; borides: titanium boride) |
| | | | Conductive carbides and borides (e.g. boron carbide) |
| | | | Aluminum, copper |
| | | | Single component semiconductors (e.g. single crystalline and polycrystalline silicon, germanium) |
| | | | Compound semiconductors (e.g. GaAs, InP, Si/Ge, SiC) |

A few preferred embodiments have been described in detail hereinabove. It is to be understood that the scope of the invention also comprehends embodiments different from those described, yet within the scope of the claims. With reference to the structures described, electrical connections to such structures can be ohmic, rectifying, capacitive, direct or indirect, via intervening circuits or otherwise. Implementation is contemplated in discrete components or fully integrated circuits in silicon, germanium, gallium arsenide, or other electronic materials families. In general the preferred or specific examples are preferred over the other alternate examples.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a microelectronic capacitor structure on an integrated circuit, said method comprising:
   (a) forming a semiconductor substrate;
   (b) forming an electrically conductive buffer layer on said semiconductor substrate;
   (c) forming a conductive donor doped perovskite layer having between about 0.01 and about 0.3 mole percent doping on said buffer layer; and
   (d) forming a high-dielectric-constant material layer on said perovskite layer, whereby said donor doped perovskite layer provides a chemically and structurally stable electrical connection to said high-dielectric-constant material layer.

2. The method according to claim 1, wherein said perovskite is selected from the group consisting of: (Ba,Sr,Pb)(Ti,Zr)$O_3$, bismuth titanate, potassium tantalate, lead niobate, lead zinc niobate, potassium niobate, lead magnesium niobate, and combinations thereof.

3. The method according to claim 1, wherein said donor is selected from the group consisting of: F, Cl, V, Nb, Mo, La, Ce, Pr, Nd, Sm, Eu, Gd, Tb, Dy, Ho, Er, Ta, W, and combinations thereof.

4. The method according to claim 1, wherein said high-dielectric-constant material layer is selected from the group consisting of: (Ba,Sr,Pb)(Ti,Zr)$O_3$, (Pb,La)(Zr,Ti)$O_3$, bismuth titanate, potassium tantalate, lead niobate, lead zinc niobate, potassium niobate, lead magnesium niobate, and combinations thereof.

5. The method according to claim 1, wherein said electrically conductive buffer layer is selected from the group consisting of: platinum, palladium, rhodium, gold, iridium, silver, ruthenium, titanium nitride, tin nitride, ruthenium nitride, zirconium nitride, ruthenium monoxide, ruthenium dioxide, tin oxide, titanium monoxide, TiON, titanium silicide, and combinations thereof.

6. The method according to claim 1, said method further comprising forming an electrically conductive layer on said high-dielectric-constant material layer.

7. The method according to claim 6, wherein said electrically conductive layer is selected from the group consisting of platinum, palladium, rhodium, gold, iridium, silver, titanium nitride, tin nitride, ruthenium nitride, zirconium nitride, ruthenium dioxide, tin oxide, titanium monoxide, titanium silicide, aluminum, and combinations thereof.

8. The method according to claim 6, wherein said electrically conductive layer is a second donor doped second perovskite having between about 0.01 and about 0.3 mole percent doping.

9. The method according to claim 8, wherein said second perovskite is selected from the group consisting of: (Ba,Sr,Pb)(Ti,Zr)$O_3$, bismuth titanate, potassium tantalate, lead niobate, lead zinc niobate, potassium niobate, lead magnesium niobate, and combinations thereof.

10. The method according to claim 8, wherein said second donor is selected from the group consisting of: F, Cl, V, Nb, Mo, La, Ce, Pr, Nd, Sm, Eu, Gd, Tb, Dy, Ho, Er, Ta, W, and combinations thereof.

11. The method according to claim 1, wherein said donor doped perovskite layer is doped between 0.1 and 0.2 mole percent.

12. The method according to claim 1, wherein said donor doped perovskite layer is doped between 0.01 and 0.29 mole percent.

13. The method according to claim 1, wherein said high-dielectric constant material layer is undoped.

14. The method according to claim 1, wherein said high-dielectric constant material layer is doped with an acceptor material selected from the group consisting of: Na, Al, Mn, Ca, K, Cr, Mn, Co, Ni, Cu, Zn, Li, Mg, and combinations thereof.

15. The method according to claim 14, wherein said high-dielectric constant material layer is doped to greater than about 0.25 mole percent doping with a donor material selected from the group consisting of: F, Cl, V, Nb, Mo, La, Ce, Pr, Nd, Sm, Eu, Gd, Tb, Dy, Ho, Er, Ta, W, and combinations thereof.

16. The method according to claim 1, wherein said high-dielectric constant material layer is doped to greater than about 0.25 mole percent doping with a donor material selected from the group consisting of: F, Cl, V, Nb, Mo, La, Ce, Pr, Nd, Sm, Eu, Gd, Tb, Dy, Ho, Er, Ta, W, and combinations thereof.

* * * * *